United States Patent
Du et al.

(10) Patent No.: US 9,971,466 B2
(45) Date of Patent: *May 15, 2018

(54) TOUCH PANEL AND TOUCH ELECTRONIC DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Lingxiao Du, Shanghai (CN); Qijun Yao, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 67 days.

This patent is subject to a terminal disclaimer.

(21) Appl. No.: 15/145,820

(22) Filed: May 4, 2016

(65) Prior Publication Data

US 2017/0090620 A1   Mar. 30, 2017

(30) Foreign Application Priority Data

Sep. 30, 2015   (CN) .......................... 2015 1 0645862

(51) Int. Cl.
*G06F 3/044* (2006.01)
*H01L 27/12* (2006.01)

(52) U.S. Cl.
CPC ............ *G06F 3/044* (2013.01); *H01L 27/124* (2013.01)

(58) Field of Classification Search
CPC ............................... G06F 3/044; H01L 27/124
See application file for complete search history.

(56) References Cited

U.S. PATENT DOCUMENTS 9,778,791 B2 * 10/2017 Yao ........................ G06F 3/0418
2013/0240341 A1     9/2013 Lo et al.
(Continued)

FOREIGN PATENT DOCUMENTS

CN     104699314 A     6/2015
CN     104777692 A     7/2015

OTHER PUBLICATIONS

The Chinese First Office Action dated Jul. 21, 2017 in the corresponding Chinese Application (Application No. 201510645862.4).

*Primary Examiner* — Lixi C Simpson
(74) *Attorney, Agent, or Firm* — Kilpatrick Townsend & Stockton LLP

(57) ABSTRACT

A touch panel includes multiple common electrode blocks arranged in an array and multiple touch wires. Each of the touch wires is electrically connected to corresponding one of the common electrode blocks and is insulated from other common electrode blocks that are insulated from the one of the touch wire. The other common electrode blocks are in the same layer with the touch wire. There is a gap in a common electrode block that is located at a path of the touch wire and that is insulated from the touch wire. The common electrode block that is electrically connected to the touch wire comprises a first and a second common electrode sub-blocks, both of which are adjacent to the gap. The first common electrode sub-block is connected to the second common electrode sub-block through at least one bridge electrode.

20 Claims, 6 Drawing Sheets

(56) References Cited

U.S. PATENT DOCUMENTS

| | | | |
|---|---|---|---|
| 2014/0306916 A1* | 10/2014 | Wang | G06F 3/041 |
| | | | 345/173 |
| 2014/0362031 A1* | 12/2014 | Mo | G09G 3/36 |
| | | | 345/174 |
| 2016/0291725 A1 | 10/2016 | Zhai | |
| 2016/0328058 A1 | 11/2016 | Peng | |
| 2016/0357312 A1* | 12/2016 | Li | G06F 3/044 |
| 2016/0378240 A1* | 12/2016 | Li | G06F 3/0412 |
| | | | 345/174 |
| 2017/0045988 A1* | 2/2017 | Sugita | G06F 3/044 |

\* cited by examiner

B-B'

TOUCH PANEL AND TOUCH ELECTRONIC DEVICE

This application claims priority to Chinese Patent Application No. 201510645862.4, entitled "TOUCH PANEL AND TOUCH ELECTRONIC DEVICE", filed with the Chinese Patent Office on Sep. 30, 2015, which is incorporated by reference in its entirety herein.

FIELD

The disclosure relates to the technical field of touch device, and in particular, to a touch panel and a touch electronic device.

BACKGROUND

With the development of science and technology, a touch electronic device is more and more widely applied in people's daily life and work, which is convenient for people's daily life and work, and becomes an important and indispensable tool.

In the touch electronic device, a touch panel is a major component for implementing a touch function. A touch detection of a conventional touch panel has poor accuracy, resulting in a low reliability of the touch electronic device.

SUMMARY

To solve the above problem, a touch panel and a touch electronic device are provided according to the present disclosure, to improve the touch detection accuracy of the touch panel and the reliability of the touch electronic device.

The following technical solutions are provided according to the present disclosure, to achieve the above objections.

A touch panel, which includes:
- a plurality of common electrode blocks arranged in an array; and
- a plurality of touch wires, wherein each of the touch wires is electrically connected to corresponding one of the common electrode blocks and is insulated from other common electrode blocks, wherein the other common electrode blocks are disposed at the same layer with the touch wire, there is a gap in a common electrode block that is located at a path of the touch wire and that is insulated from the touch wire, the common electrode block that is electrically connected to the touch wire comprises a first common electrode sub-block and a second common electrode sub-block, both of which are adjacent to the gap in the common electrode block that is located at a path of the touch wire and that is insulated from the touch wire, and the first common electrode sub-block is connected to the second common electrode sub-block through at least one bridge electrode.

A touch electronic device is further provided according to the present disclosure, which includes the above touch panel.

Compared to the conventional technology, the technical solutions according to the present disclosure have several advantages. For example, in the touch panel and the touch electronic device according to the present disclosure, the common electrode block is arranged in the same layer with the touch wire; and a gap is disposed at a common electrode block which is located on a path of a wire, to get the wire through. A first common electrode sub-block and a second common electrode sub-block of the common electrode block are respectively arranged at both sides of a gap, which are connected through a bridge electrode. In this way, a parasitic capacitance between the touch wire and the common electrode block may be reduced, and the effect of touch performance from the parasitic capacitance may be decreased, and thus the touch detection accuracy of a touch panel and the reliability of an electronic device may be improved.

BRIEF DESCRIPTION OF THE DRAWINGS

To illustrate technical solutions according to embodiments of the present disclosure or in the conventional technologies more clearly, drawings to be used in the descriptions of the conventional technologies or the embodiments are described briefly hereinafter. Apparently, the drawings described hereinafter are only for some embodiments of the present disclosure, and other drawings may be obtained by those skilled in the art based on those drawings without creative efforts.

DETAILED DESCRIPTION OF EMBODIMENTS

Technical solutions in embodiments of the present disclosure are described clearly and completely hereinafter in conjunction with the drawings in the embodiments of the present disclosure. Apparently, the described embodiments are only a part rather than all of the embodiments of the present application. All the other embodiments obtained by those skilled in the art without creative effort on the basis of the embodiments of the present disclosure fall within the scope of protection of the present disclosure.

Figure 1:
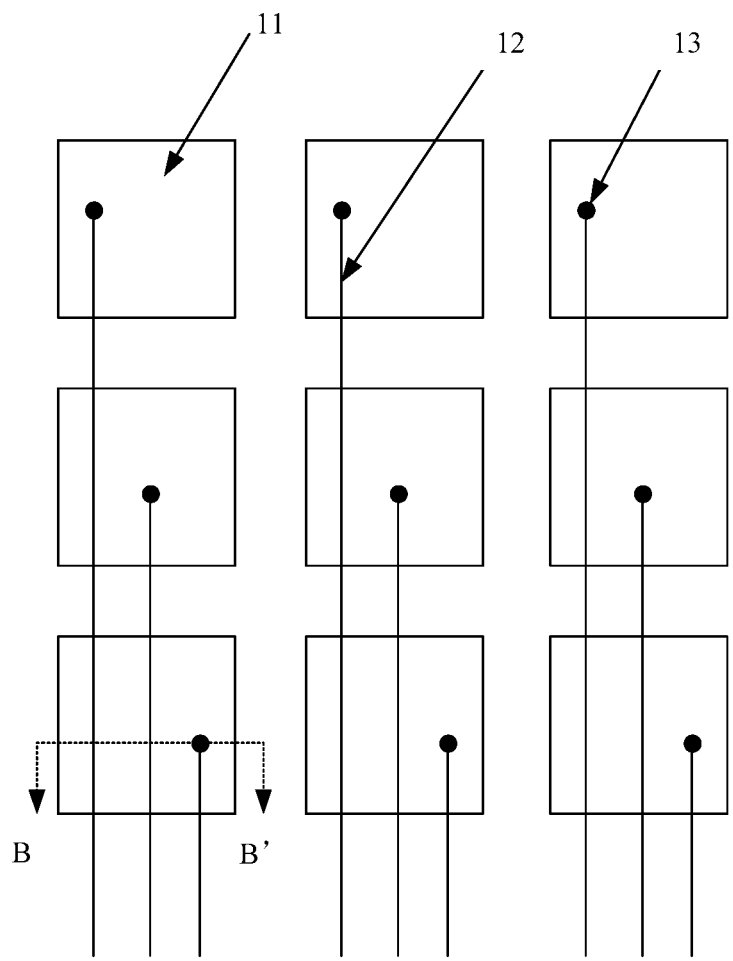
FIG. 1 is a schematic structural diagram of a common touch panel in the conventional technology.
Figure 2:
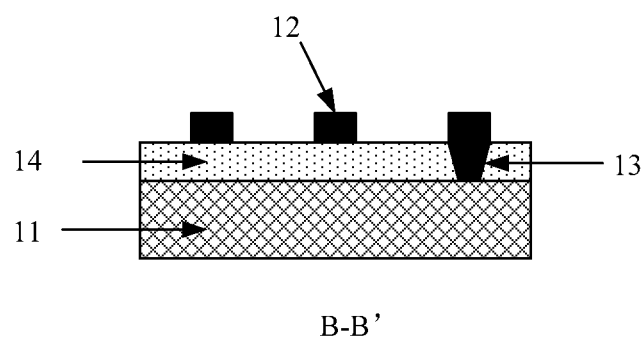
FIG. 2 is a cross-section diagram of the touch panel as shown in FIG. 1 taken along line B-B'.

Reference is made to FIG. 1 and FIG. 2. FIG. 1 is a schematic structural diagram of a common touch panel in the conventional technology; and FIG. 2 is a cross-section diagram of the touch panel as shown in FIG. 1 taken in line B-B'. The touch panel includes: multiple common electrode blocks 11 arranged in an array; and multiple touch wires 12 connected to the corresponding common electrode blocks 11, where a one-to-one correspondence exists between the touch wires and common electrode blocks. The common electrode block 11 and the touch wire 12 are arranged in different layers. An insulating layer 14 is arranged between the common electrode block 11 and the touch wire 12. The common electrode block 11 is connected to the touch wire 12 through a via hole 13.

In the above touch panel, the touch wire 12 and the common electrode block 11 are respectively arranged in an upper layer and a lower layer, and thus a parasitic capacitance is generated in a direction perpendicular to the touch panel. When a finger touches the touch panel to perform a touch control, the parasitic capacitance may seriously influence touch detection accuracy, hence reducing the reliability of an electronic device. To solve the above problems, a touch panel is provided according to the present disclosure, which includes multiple common electrode blocks arranged in an array, and multiple touch wires. One of the multiple touch wires is electrically connected to one of the multiple common electrode blocks correspondingly and is insulated from the other multiple common electrode blocks. The common electrode blocks are insulated from the one of the touch wires are disposed at the same layer with the touch wires. There is a gap in a common electrode block that is located at a path of the touch wire and that is insulated from the touch wire. The common electrode block that is electrically connected to the touch wire comprises a first common electrode sub-block and a second common electrode sub-block, both of which are adjacent to the gap in the common electrode block that is located at a path of the touch wire and that is insulated from the touch wire, and the first common electrode sub-block is connected to the second common electrode sub-block through at least one bridge electrode.

In the touch panel, the common electrode block is arranged at the same layer with the touch wire. A gap is disposed in a common electrode block, through which a wire passes. The touch wire is disposed in the gap, to get through the common electrode block. A first common electrode sub-block and a second common electrode sub-block of the common electrode block are respectively arranged at both sides of the gap, which are connected through a bridge electrode. In this way, a parasitic capacitance between the touch wire and the common electrode block may be reduced, and the effect of touch performance from the parasitic capacitance may be decreased, and thus the touch detection accuracy of a touch panel and the reliability of an electronic device may be improved.

Embodiments of the present disclosure are further described clearly hereinafter in conjunction with drawings.

Figure 3:
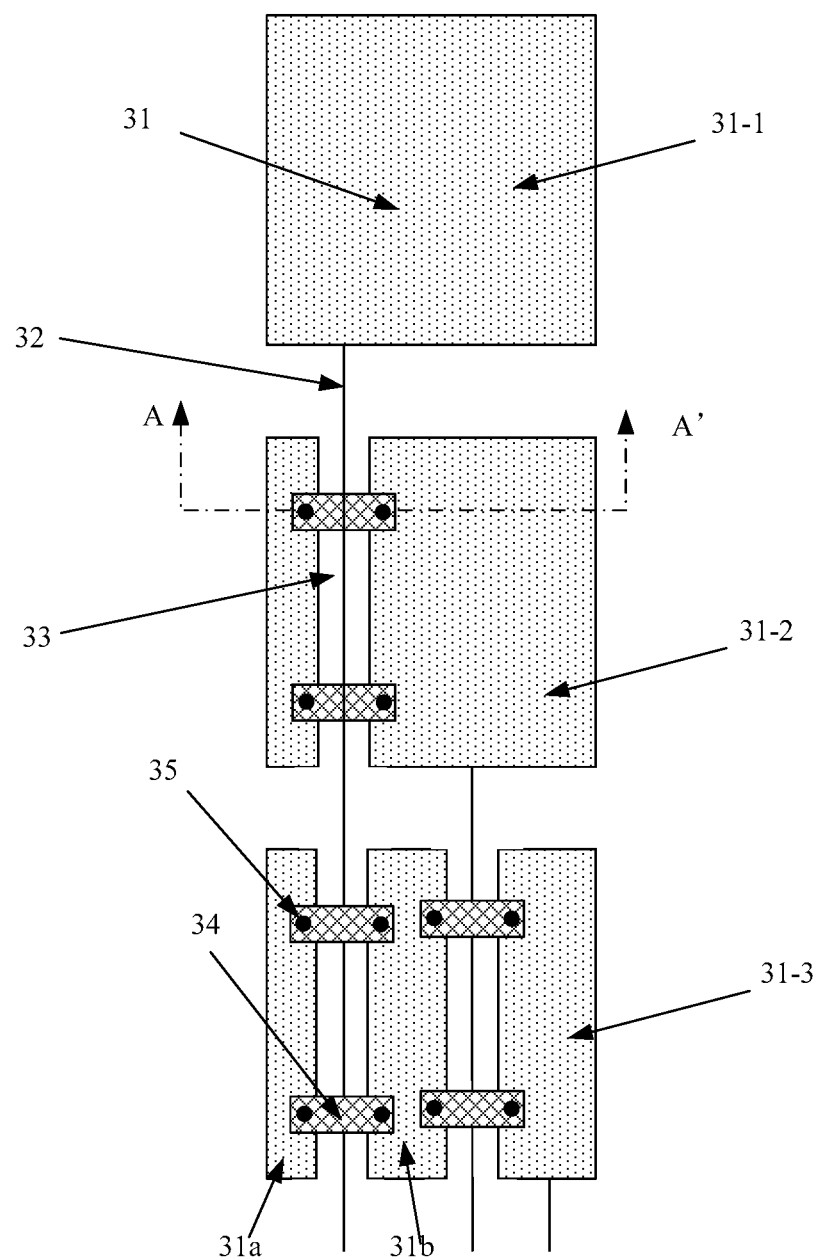
FIG. 3 is a top view of a touch panel according to an embodiment of the present disclosure.
Figure 4:
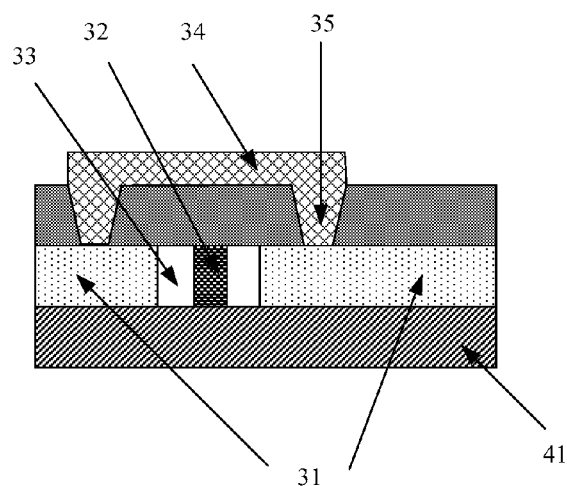
FIG. 4 is a sectional drawing of the touch panel as shown in FIG. 3 taken along line A-A'.

Reference is made to FIG. 3 and FIG. 4. FIG. 3 is a top view of a touch panel according to an embodiment of the present disclosure; and FIG. 4 is a sectional drawing of a touch panel as shown in FIG. 3 taken along line A-A'.

The touch panel includes multiple common electrode blocks 31 arranged in an array; and multiple touch wires 32. One of the multiple touch wires 32 is electrically connected to corresponding one of the multiple common electrode blocks 31 and is insulated from the other of the multiple common electrode blocks 31. The common electrode blocks 31 are insulated from the one of the touch wire 32 are disposed at the same layer with the touch wires 32.

In the embodiment as shown in FIG. 3, common electrode blocks sequentially located in one column, such as a common electrode block 31-1, a common electrode block 31-2 and a common electrode block 31-3, are taken as an example. Taking a touch wire 32 connected to the common electrode block 31-1 as an example, the touch wire 32 is electrically connected to the common electrode block 31-1, and insulated from the common electrode block 31-2 and the common electrode block 31-3. The touch wire 32 is disposed at the same layer with the common electrode block 31-2 and the common electrode block 31-3.

In embodiments of the present disclosure, the numbers of rows and columns of the array will not be limited, which is set based on the size of a touch panel.

For each of the touch wires 32, a gap 33 is disposed at the common electrode block 31 located at a path of the touch wire 32 and insulated from the touch wire 32, so as to get the touch wire 32 through. For the touch wire 32 of the common electrode block 31-1, gaps 33 are disposed at both the common electrode block 31-2 and the common electrode block 31-3, to get the touch wire 32 through.

The common electrode block 31 disposed with a gap 33 includes a first common electrode sub-block 31a and a second common electrode sub-block 31b, both of which are adjacent to the gap 33 of the common electrode block 31, namely for a preset gap 33, at the two sides of the common electrode block 31. That is, the first common electrode sub-block 31a are disposed at one side of the gap 33, and the second common electrode sub-block 31b are disposed at another side of the gap 33. The first common electrode sub-block 31a is connected to the second common electrode sub-block 31b through at least one bridge electrode.

FIG. 4 is a sectional drawing of the touch panel shown in FIG. 3 taken along line A-A'. As shown in FIG. 4, the touch panel includes a transparent substrate 41, the common electrode block 31, and the touch wire 32, where the common electrode block 31 and the touch wire 32 are disposed on the same surface of the transparent substrate 41. The common electrode block 31 is disposed on the transparent substrate 41 and between the transparent substrate 41 and the bridge electrode 34. That is, the bridge electrode 34 is located at a side of the common electrode block 31 opposite to the transparent substrate 41.

In the embodiment, the touch wire 32 is disposed at the same layer with the common electrode block 31, a capacitance between the touch wire 32 and the common electrode block 31 is a parasitic capacitance in horizontal direction. Compared to the conventional technology that a touch wire and a common electrode block are disposed at different layers respectively and the parasitic capacitance in the vertical direction, the parasitic capacitance with a horizontal gap has a little influence on the touch detection accuracy when a finger touches the touch panel to perform a touch control.

For the first common electrode sub-block 31a and the second common electrode sub-block 31b located at the two sides of the gap 33 in one common electrode block, the spacing between the first common electrode sub-block 31a and the touch wire 32 in the gap 33 is the same as the spacing between the second common electrode sub-block 31b and the touch wire 32. Optionally, the spacing between the touch wire 32 and the first common electrode sub-block 31a is larger than 2 μm; or the spacing between the touch wire 32 and the second common electrode sub-block 31b is larger than 2 μm. In the other embodiment, the spacing between the first common electrode sub-block 31a and the touch wire 32 in the gap 33 may be different from that between the second common electrode sub-block 31b and the touch wire 32. In view of a requirement for an orientation process of the touch panel and a need of reducing light leak of a touch panel, the spacing may also be less than 2 μm.

The touch panel further includes pixel electrodes disposed in a layer different from the common electrode block. An insulating layer is disposed between the pixel electrode and the common electrode block. The bridge electrode is in the same layer as the pixel electrode. The bridge electrode is connected to the common electrode block through a via hole. The common electrode block and the pixel electrode are disposed at the same side of the transparent substrate. The common electrode block is located between the pixel electrode and the substrate. The touch panel is shown as FIG. 5.

Figure 5:
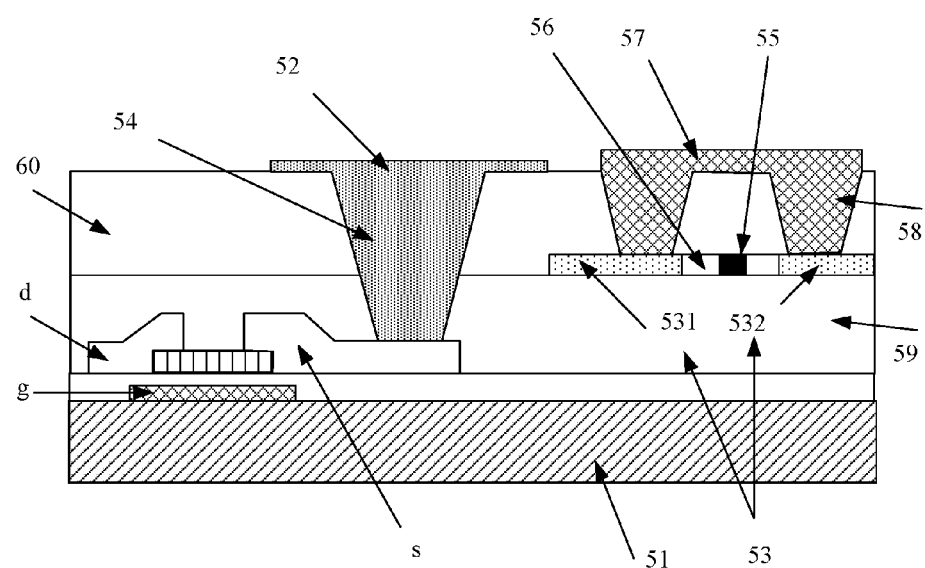
FIG. 5 is a schematic structural diagram of a touch panel according to another embodiment of the present disclosure.

Reference is made to FIG. 5, which is a schematic structural diagram of a touch panel according to another embodiment of the present disclosure. The touch panel includes a transparent substrate, a pixel electrode 52 and a common electrode block 53. The common electrode block 53 and the pixel electrode 52 are disposed at the same side of the transparent substrate, and the common electrode block 53 is located between the pixel electrode 52 and the transparent substrate.

In the embodiment as shown in FIG. 5, the transparent substrate is a TFT (Thin Film Transistor) array substrate, which includes a transparent substrate plate 51 and multiple TFT devices disposed on the transparent substrate plate 51. Each of the TFT device includes a gate g, a source s and a drain d. The TFT array substrate further includes a gate line connected to the gate g of the TFT device and a data line connected to the drain d of the TFT device. The gate line and the data line are not shown in FIG. 5. The pixel electrode 52 is connected to the source s of the TFT device through a via hole 54.

A gap 56 is provided at some of common electrode blocks 53, to pass the touch wire 55 connected to the other common electrode block through. In multiple common electrode blocks arranged in an array, in the case that all the touch wires extend vertically down as shown in FIG. 3, the common electrode blocks in the first line do not need the gap, and each of common electrode blocks in the other lines need to dispose the gap.

The data line is located between the touch wire 55 and the transparent substrate plate 51. In a direction perpendicular to the transparent substrate plate 51, a projection of the gap 56 on the transparent substrate plate 51 is overlaid with a projection of the data line on the transparent substrate plate 51, therefore avoiding a leakage of an electric field formed by an electric signal of the data line and avoiding a light leak.

In the embodiment shown in FIG. 5, the common electrode block 53 is located between the pixel electrode 52 and the TFT array substrate. In a direction perpendicular to the TFT array substrate, an insulating layer 59 is disposed between the common electrode block 53 and the TFT array substrate; and another insulating layer 60 is disposed between pixel electrode 52 and the common electrode block 53.

The pixel electrode 52 is connected to the source s through a via hole 54. The common electrode block 53 disposed with a gap 56 includes a first common electrode sub-block 531 and a second common electrode sub-block 532, both of which are adjacent to the gap 56 of the common electrode block 53. The first common electrode sub-block 531 is connected to the second common electrode sub-block 532 through a bridge electrode 57. The bridge electrode 57 is electrically connected to the common electrode block 53 through a via hole 58.

In the touch panel according to the embodiment of the present disclosure, the touch wire 55 is disposed in the same layer with the common electrode block 53, which is located at the inside of the touch panel, therefore avoiding the problem of poor corrosion resistance when the touch wire 55 is located at the outside of the touch panel, and improving the reliability of the touch panel.

Figure 6:
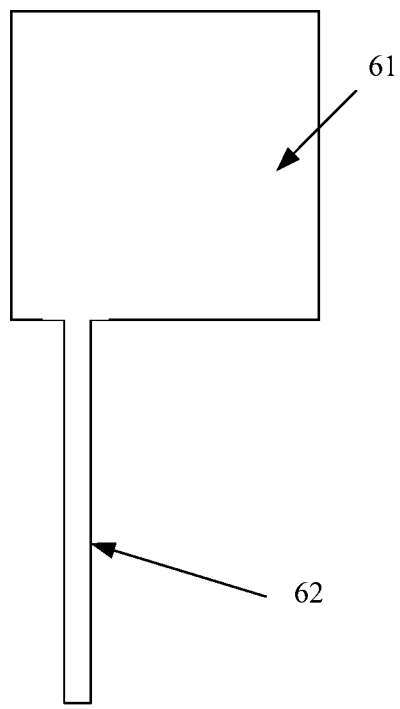
FIG. 6 is a schematic structural diagram of a touch panel according to another embodiment of the present disclosure.

Reference is made to FIG. 6, which is a schematic structural diagram of a touch panel according to another embodiment of the present disclosure. In the embodiment as shown in FIG. 6, the common electrode block 61 and the touch wire 62 are prepared at the same conductive layer in the same process. In the process of manufacturing the touch panel according to the embodiment, a conductive layer may be formed. Then multiple common electrode blocks, the touch wires connected to the common electrode blocks correspondingly, and gaps formed in a part of common electron blocks to get the touch wires through are formed by an etching process.

Figure 7:
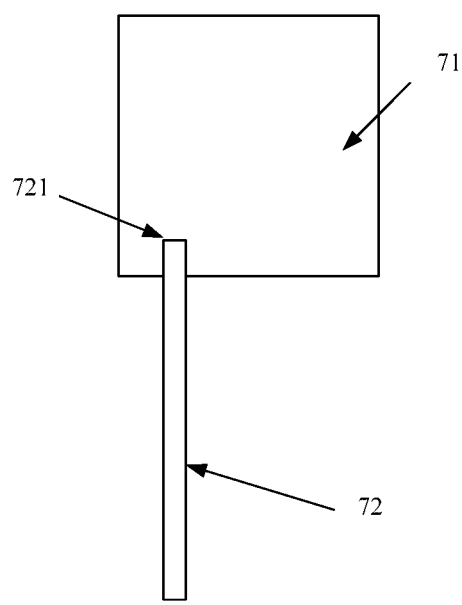
FIG. 7 is a schematic structural diagram of a touch panel according to another embodiment of the present disclosure.

Reference is made to FIG. 7, which is a schematic structural diagram of a touch panel according to another embodiment of the present disclosure. In the embodiment as shown in FIG. 7, a touch wire 72 connected to a common electrode block 71 further includes an overlapping part 721. The touch wire 72 is electrically connected to the common electrode block 71 corresponding to the touch wire 72 through the overlapping part 721. In the process of manufacturing the touch panel according to the embodiment, a conducting layer is formed, and multiple electrode blocks and gaps formed in a part of common electrode blocks to get the touch wires through are formed by an etching process. Then, the touch wires 72 correspondingly connected to the electrode blocks is formed separately.

Figure 8:
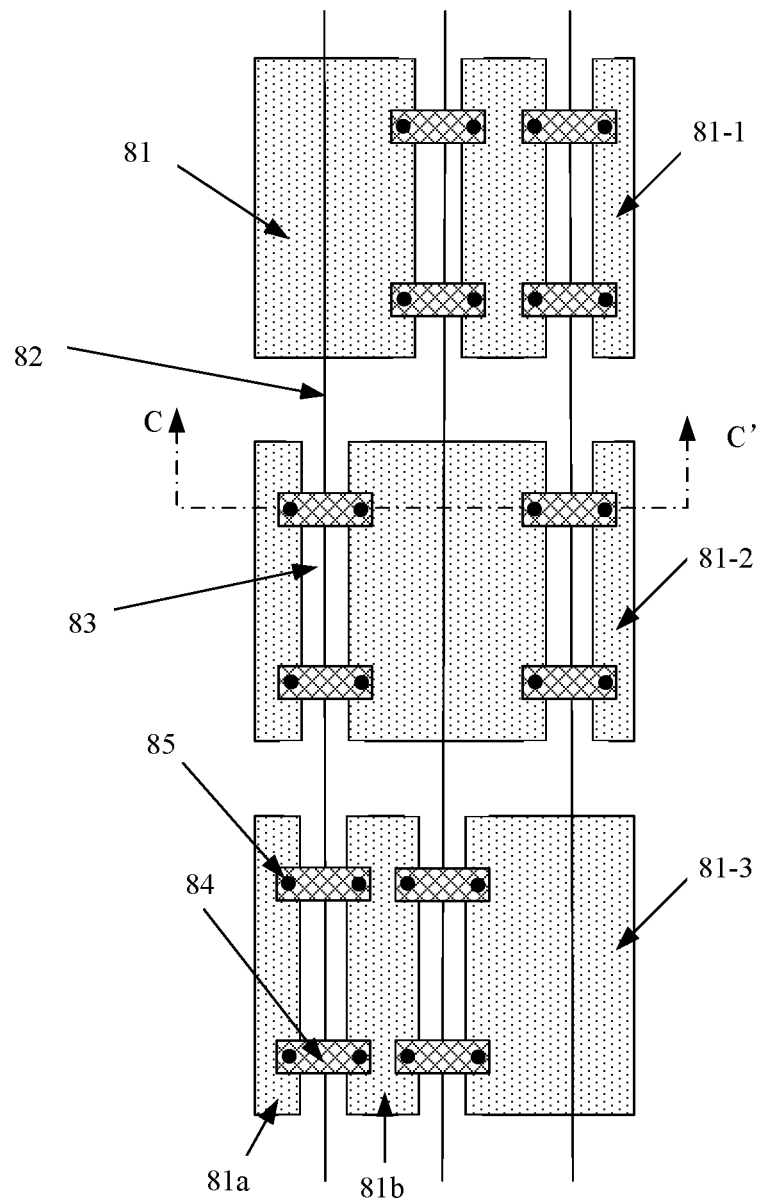
FIG. 8 is a schematic structural diagram of a touch panel according to another embodiment of the present disclosure.
Figure 9:
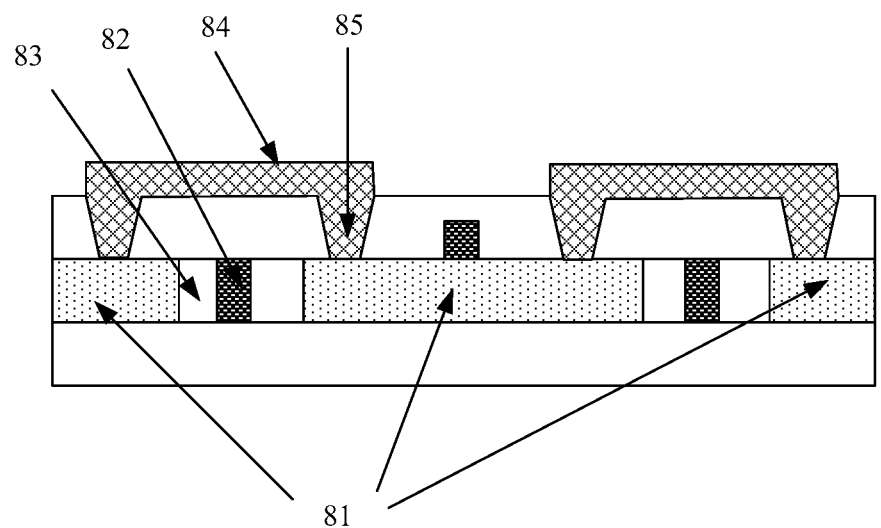
FIG. 9 is a cross-section diagram of the touch panel as shown in FIG. 8 taken along line C-C'.

Reference is made to FIG. 8 and FIG. 9. FIG. 8 is a schematic structural diagram of a touch panel according to another embodiment of the present disclosure. FIG. 9 is a cross-section diagram of the touch panel as shown in FIG. 8 taken along line C-C'. On the basis of the embodiment shown in FIG. 3, in the touch panel according the embodiment as shown in FIG. 8, all the touch wires 82 get through an array of common electrode blocks 81. Taking the leftmost touch wire 82 as an example, a common electrode block 81-2 and a common electrode block 81-3, which are insulated from the touch wire 82, are both disposed with a gap 33 to get the touch wire 82 through. The touch wire 82 covers the common electrode block 81-1, and is electrically connected to the common electrode block 81-1. A first common electrode sub-block 81a and a second common electrode sub-block 81b are located at the both sides of the gap 83 respectively, and are electrically connected through a bridge 84 and a via hole 85, which is the same as that in the above embodiment.

In the embodiment as shown in FIG. 8, the touch wire 82 and the common electrode block 81 are prepared in different conducting layers. The common electrode block 81 and the corresponding gap 83 are first formed, and then the touch wire 82 is prepared. In the embodiment, all touch wires are same, which have the same resistance and the same parasitic capacitance. Thus, the touch panel has a good reliability. In the other embodiments according to the present disclosure, the common electrode block 81 and the corresponding gap 83 may also be first formed, and then the touch wire 82 is prepared.

It is known from the above description that in the touch panel according to embodiments of the present disclosure, the touch wire and the common electrode insulated from the touch wire are provided at the same layer, to avoid generating a parasitic capacitance between the touch wire and the common electrode block insulated from each other in the direction perpendicular to the touch panel, and ensure the accuracy of touch detection.

Based on the above embodiments of each touch panel, a touch electronic device is further provided according to an embodiment of the present disclosure, which includes the touch panel described in the above embodiments.

The touch electronic device may be an electronic device with a touch display screen such as a mobile phone and a tablet computer.

The touch panel described in above embodiments is applied to the touch electronic device. Thus, the touch electronic device has a high accuracy of touch detection and a good reliability.

Those skilled in the art are able to perform or apply the disclosure according to the above description of the disclosed embodiment. It is apparent for those skilled in the art to modify the embodiments in many ways. The general principle suggested by the application can be achieved in other embodiments without departing from the scope of the disclosure. Therefore, the disclosure should not be limited by these embodiments shown in the specification, but conform to the widest scope in accordance with the principle and the novelty disclosed in the disclosure.

The invention claimed is:

1. A touch panel, comprising:
   a plurality of common electrode blocks arranged in an array; and
   a plurality of touch wires, wherein each of the touch wires is electrically connected to corresponding one of the common electrode blocks and is insulated from other common electrode blocks, wherein
   the other common electrode blocks are disposed at the same layer with the touch wire,
   there is a gap in a common electrode block that is located at a path of the touch wire and that is insulated from the touch wire, and
   the common electrode block that is located at the path of the touch wire and that is insulated from the touch wire comprises a first common electrode sub-block and a second common electrode sub-block, both of which are adjacent to the gap in the common electrode block that is located at the path of the touch wire and that is insulated from the touch wire, and the first common electrode sub-block is connected to the second common electrode sub-block through at least one bridge electrode.

2. The touch panel according to claim 1, comprising a transparent substrate, wherein the common electrode block that is located at the path of the touch wire and that is insulated from the touch wire is disposed on the transparent substrate and is located between the transparent substrate and the bridge electrode.

3. The touch panel according to claim 2, wherein within the common electrode block that is located at the path of the touch wire and that is insulated from the touch wire, spacing between the first common electrode sub-block and the touch wire is the same as spacing between the second common electrode sub-block and the touch wire.

4. The touch panel according to claim 3, wherein the spacing between the touch wire and the first common electrode sub-block is larger than 2 μm, or the spacing between the touch wire and the second common electrode sub-block is larger than 2 μm.

5. The touch panel according to claim 2, further comprising a pixel electrode, wherein the pixel electrode and the common electrode block that is located at the path of the touch wire and that is insulated from the touch wire are disposed in different layers;
   wherein an insulating layer is disposed between the pixel electrode and the common electrode block that is located at the path of the touch wire and that is insulated from the touch wire,
   the bridge electrode is disposed in the same layer with the pixel electrode, and the bridge electrode is connected to the common electrode block that is located at the path of the touch wire and that is insulated from the touch wire through a via hole.

6. The touch panel according to claim 5, wherein
   the common electrode block that is located at the path of the touch wire and that is insulated from the touch wire, and the pixel electrode are disposed at the same side of the transparent substrate, and
   the common electrode block that is located at the path of the touch wire and that is insulated from the touch wire is located between the pixel electrode and the transparent substrate.

7. The touch panel according to claim 6, wherein the transparent substrate is a TFT array substrate, the TFT array substrate comprises a transparent substrate plate, gate lines and data lines, wherein a plurality of TFT devices are disposed on the transparent substrate plate, one of the gate lines is connected to the gate of the corresponding TFT device, and one of the data lines is connected to the drain of the corresponding TFT device.

8. The touch panel according to claim 7, wherein in a direction perpendicular to the transparent substrate plate, a projection of the data line on the transparent substrate plate is overlaid with a projection of the touch wire in the gap on the transparent substrate plate.

9. The touch panel according to claim 1, wherein the touch wire and the common electrode block that is located at the path of the touch wire and that is insulated from the touch wire are prepared in the same process by using a same conducting layer, or by using different conducting layers.

10. The touch panel according to claim 1, wherein the touch wire further comprises an overlapping part, and the touch wire is electrically connected to the common electrode block corresponding to the touch wire through the overlapping part.

11. A touch electronic device, comprising a touch panel, wherein the touch panel comprises:
    a plurality of common electrode blocks arranged in an array; and
    a plurality of touch wires, wherein one of the touch wires is electrically connected to one of the common electrode blocks correspondingly and is insulated from the other of the common electrode blocks;
    a plurality of touch wires, wherein each of the touch wires is electrically connected to corresponding one of the common electrode blocks and is insulated from other common electrode blocks, wherein
    the other common electrode blocks are disposed at the same layer with the touch wire,
    there is a gap in a common electrode block that is located at a path of the touch wire and that is insulated from the touch wire, and
    the common electrode block that is located at the path of the touch wire and that is insulated from the touch wire comprises a first common electrode sub-block and a second common electrode sub-block, both of which are adjacent to the gap in the common electrode block that is located at the path of the touch wire and that is insulated from the touch wire, and the first common electrode sub-block is connected to the second common electrode sub-block through at least one bridge electrode.

12. The touch electronic device according to claim 11, comprising a transparent substrate, wherein the common electrode block that is located at the path of the touch wire and that is insulated from the touch wire is disposed on the transparent substrate and is located between the transparent substrate and the bridge electrode.

13. The touch electronic device according to claim 12, wherein within the common electrode block that is located at the path of the touch wire and that is insulated from the touch wire, spacing between the first common electrode sub-block and the touch wire is the same as spacing between the second common electrode sub-block and the touch wire.

14. The touch electronic device according to claim 13, wherein the spacing between the touch wire and the first common electrode sub-block is larger than 2 µm, or the spacing between the touch wire and the second common electrode sub-block is larger than 2 µm.

15. The touch electronic device according to claim 12, further comprising a pixel electrode, wherein the pixel electrode and the common electrode block that is located at the path of the touch wire and that is insulated from the touch wire are disposed in different layers;
wherein an insulating layer is disposed between the pixel electrode and the common electrode block that is located at the path of the touch wire and that is insulated from the touch wire,
the bridge electrode is disposed in the same layer with the pixel electrode, and the bridge electrode is connected to the common electrode block that is located at the path of the touch wire and that is insulated from the touch wire through a via hole.

16. The touch electronic device according to claim 15, wherein
the common electrode block that is located at the path of the touch wire and that is insulated from the touch wire, and the pixel electrode are disposed at the same side of the transparent substrate, and
the common electrode block that is located at the path of the touch wire and that is insulated from the touch wire is located between the pixel electrode and the transparent substrate.

17. The touch electronic device according to claim 16, wherein the transparent substrate is a TFT array substrate, the TFT array substrate comprises a transparent substrate plate, gate lines and data lines, wherein a plurality of TFT devices are disposed on the transparent substrate plate, one of the gate lines is connected to the gate of the corresponding TFT device, and one of the data lines is connected to the drain of the corresponding TFT device.

18. The touch electronic device according to claim 17, wherein in a direction perpendicular to the transparent substrate plate, a projection of the data line on the transparent substrate plate is overlaid with a projection of the touch wire in the gap on the transparent substrate plate.

19. The touch electronic device according to claim 11, wherein the touch wire and the common electrode block that is located at the path of the touch wire and that is insulated from the touch wire are prepared in the same process by using a same conducting layer, or by using different conducting layers.

20. The touch electronic device according to claim 11, wherein the touch wire further comprises an overlapping part, and the touch wire is electrically connected to the common electrode block corresponding to the touch wire through the overlapping part.

* * * * *